United States Patent
Kuo et al.

(10) Patent No.: US 11,522,112 B2
(45) Date of Patent: Dec. 6, 2022

(54) LIGHT EMITTING DIODE AND MANUFACTURING METHOD THEREOF

(71) Applicants: Lextar Electronics Corporation, Hsinchu (TW); ULTRA DISPLAY TECHNOLOGY CO., LTD., Taipei (TW)

(72) Inventors: Shiou-Yi Kuo, Hsinchu (TW); Jian-Chin Liang, Hsinchu (TW); Shen-De Chen, Taipei (TW)

(73) Assignees: Lextar Electronics Corporation, Hsinchu (TW); ULTRA DISPLAY TECHNOLOGY CO., LTD., Taipei (TW)

(*) Notice: Subject to any disclaimer, the term of this patent is extended or adjusted under 35 U.S.C. 154(b) by 58 days.

(21) Appl. No.: 16/777,796

(22) Filed: Jan. 30, 2020

(65) Prior Publication Data

US 2020/0251640 A1 Aug. 6, 2020

(30) Foreign Application Priority Data

Feb. 1, 2019 (CN) .......................... 201910104277.1

(51) Int. Cl.
*H01L 33/00* (2010.01)
*H01L 33/62* (2010.01)

(52) U.S. Cl.
CPC .......... *H01L 33/62* (2013.01); *H01L 33/0093* (2020.05); *H01L 2933/0066* (2013.01)

(58) Field of Classification Search
None
See application file for complete search history.

(56) References Cited

U.S. PATENT DOCUMENTS

| | | | |
|---|---|---|---|
| 5,286,335 | A | 2/1994 | Drabik et al. |
| 6,709,883 | B2 | 3/2004 | Yang et al. |
| 6,784,463 | B2 | 8/2004 | Camras et al. |
| 6,872,635 | B2 | 3/2005 | Hayashi et al. |
| 7,625,778 | B2 | 12/2009 | Chen |
| 7,795,629 | B2 | 9/2010 | Watanabe et al. |
| 8,541,789 | B2 | 9/2013 | Yao et al. |
| 9,893,041 | B2 | 2/2018 | Pokhriyal et al. |
| 9,941,262 | B2 | 4/2018 | Thompson |
| 2010/0186883 | A1 | 7/2010 | Tomoda |

(Continued)

FOREIGN PATENT DOCUMENTS

| | | |
|---|---|---|
| CN | 101529605 A | 9/2009 |
| CN | 102623582 A | 8/2012 |

(Continued)

*Primary Examiner* — Robert K Carpenter
(74) *Attorney, Agent, or Firm* — CKC & Partners Co., LLC

(57) ABSTRACT

A light emitting diode includes an active layer, a first type semiconductor layer, a second type semiconductor layer, a coupling layer, and a sacrificial thin film. The first type semiconductor layer and the second type semiconductor layer are disposed at opposite sides of the active layer. The coupling layer is disposed on the second type semiconductor layer. The sacrificial thin film is disposed on the coupling layer, in which the coupling layer is disposed between the sacrificial thin film and the second type semiconductor layer, and the sacrificial thin film has a thickness less than a total thickness of the first type semiconductor layer, the active layer, the second type semiconductor layer and the coupling layer.

14 Claims, 7 Drawing Sheets

(56) References Cited

U.S. PATENT DOCUMENTS

| | | | |
|---|---|---|---|
| 2016/0141474 A1* | 5/2016 | Huang | H01L 33/382 |
| | | | 257/98 |
| 2017/0236811 A1 | 8/2017 | Pokhriyal et al. | |
| 2017/0288102 A1 | 10/2017 | Farrens et al. | |
| 2018/0114878 A1 | 4/2018 | Danesh et al. | |
| 2018/0198047 A1 | 7/2018 | Danesh et al. | |
| 2021/0036187 A1* | 2/2021 | Lee | H01L 25/167 |

FOREIGN PATENT DOCUMENTS

| | | | | |
|---|---|---|---|---|
| CN | 105359282 A | 2/2016 | | |
| CN | 106816408 A | 6/2017 | | |
| CN | 107046004 A | 8/2017 | | |
| CN | 107369746 A | 11/2017 | | |
| CN | 107968066 A | 4/2018 | | |
| CN | 108431971 A | 8/2018 | | |
| CN | 108463891 A | 8/2018 | | |
| CN | 108878604 A | 11/2018 | | |
| CN | 109192821 A | 1/2019 | | |
| JP | 2006140398 A | 6/2006 | | |
| TW | I308397 B | 4/2009 | | |
| WO | WO-2018143751 A1 * | 8/2018 | | H01L 33/00 |
| WO | WO-2018151553 A1 * | 8/2018 | | H01L 31/20 |

* cited by examiner

LIGHT EMITTING DIODE AND MANUFACTURING METHOD THEREOF

CROSS-REFERENCE TO RELATED APPLICATION

This application claims priority to China Application Serial Number 201910104277.1, filed Feb. 1, 2019, which is herein incorporated by reference in its entirety.

BACKGROUND

Field of Invention

The present disclosure generally relates to a light emitting diode and a method for manufacturing a light emitting diode.

Description of Related Art

Micro light-emitting diodes (micro LEDs) are considered as a new generation of display techniques. The micro LEDs possesses a variety of advantages such as low power consumption, high luminance, high resolution and excellent color saturation. Accordingly, display panels made with the micro LEDs are regarded as the mainstream of the display technologies for the next generation.

However, since the volume of the micro LED ranges in the level of micrometer, several stages of mass-transfer (i.e., transferring a huge amount of micro LEDs) are required for the manufacture of the display device. In the mass-transfer processes, it is prone to appear problems of non-uniform strength and misalignment. Moreover, in order to increase the yield of mass-transfer processes, weakened structures have to be additionally formed. Accordingly, there is a need for a novel micro LED and manufacturing process to reduce the number of mass-transfer and increase the yield.

SUMMARY

According to one aspect of the present disclosure, a light emitting diode is provided. The light emitting diode comprises an active layer, a first type semiconductor layer, a second type semiconductor layer, a coupling layer, and a sacrificial thin film. The first type semiconductor layer and the second type semiconductor layer are disposed at opposite sides of the active layer. The coupling layer is disposed on the second type semiconductor layer. The sacrificial thin film is disposed on the coupling layer, in which the coupling layer is disposed between the sacrificial thin film and the second type semiconductor layer, and the sacrificial thin film has a thickness less than a total thickness of the first type semiconductor layer, the active layer, the second type semiconductor layer and the coupling layer.

According to one or more embodiments of the present invention, the second type semiconductor layer comprises a roughened top surface, and the roughened top surface is in contact with the coupling layer.

According to one or more embodiments of the present invention, the thickness of the sacrificial thin film is less than 3 μm.

According to one or more embodiments of the present invention, the sacrificial thin film includes a material that is capable of being dissociated by a laser beam.

According to one or more embodiments of the present invention, the light emitting diode further comprises a first contact and a second contact, wherein the first contact is electrically connected to the first type semiconductor layer, and the second contact is electrically connected to the second type semiconductor layer.

According to one or more embodiments of the present invention, the coupling layer comprises an oxide, a nitride, a polymer, or a combination thereof.

According to one or more embodiments of the present invention, each of the first type semiconductor layer and the second type semiconductor layer comprises a group III-V semiconductor.

According to another aspect of the present disclosure, a method for manufacturing a light emitting diode is provided. The method comprises: providing a first substrate; forming a sacrificial thin film on the first substrate; bonding an epitaxial structure with the sacrificial thin film by using a coupling layer, in which the epitaxial structure comprises a first type semiconductor layer, an active layer, a second type semiconductor layer, and a second substrate in sequence, wherein the first type semiconductor layer is in contact with the coupling layer; removing the second substrate; performing a componentization process on the sacrificial thin film, the coupling layer, the first type semiconductor layer, the active layer, and the second type semiconductor layer to form a plurality of light emitting diodes on the first substrate, wherein the light emitting diodes are separated from each other; and performing a laser lift-off process on the sacrificial thin film to separate each of the light emitting diodes from the first substrate.

According to one or more embodiments of the present invention, removing the second substrate comprises performing an etching process.

According to one or more embodiments of the present invention, the componentization process comprises forming a first contact on the first type semiconductor layer and a second contact on the second type semiconductor layer.

The light emitting diode and the manufacturing method thereof provided herein may reduce the number of mass-transfer processes and improve the yield.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
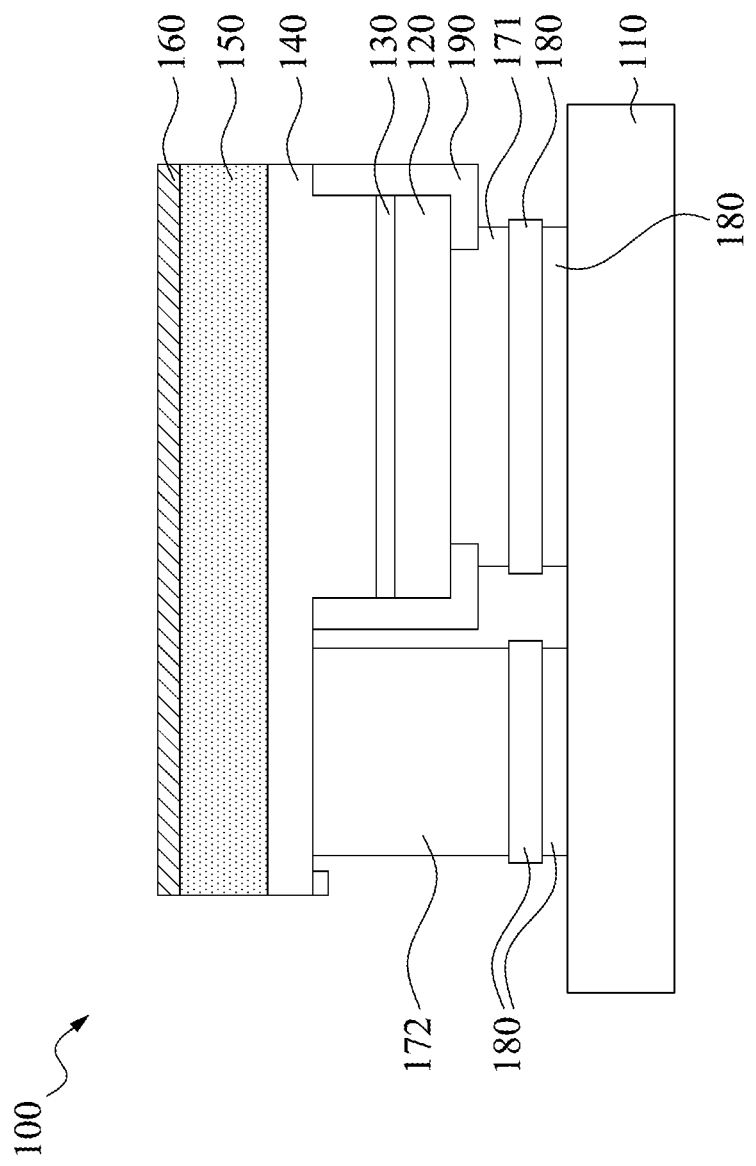
FIG. 1 is a cross-sectional view illustrating a light emitting diode 100 according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the dimensions of the elements are not limited by the scope or value of the disclosure, but may depend on the process conditions and/or desired characteristics of the elements.

Furthermore, in the various examples of the present disclosure, the reference numerals and/or letters may be repeated. This repetition is for the sake of simplicity and does not indicate a relationship between the various embodiments and/or configurations discussed. Furthermore, in the present disclosure, the following features are formed, connected to and/or coupled to another feature, this may include embodiments in which the features form a direct contact, and may also include embodiments in which additional features are inserted to form features such that the features are not in direct contact. Further, for ease of description, spatially relative terms (such as "below", "lower", "above", "upper", and the like) may be used herein to describe one of the elements illustrated in the figures or a relationship of a feature to another element (or elements) or feature (or features). Spatially relative terms are intended to encompass different orientations of the elements in use or operation.

Reference is made to FIG. 1, which is a cross-sectional view illustrating a light emitting diode 100 according to one embodiment of the present invention. The light emitting diode 100 includes a first type semiconductor layer 120, an active layer 130, a second type semiconductor layer 140, a coupling layer 150 and a sacrificial thin film 160. The active layer 130 may be a multiple quantum well (MQW) having a multi-layered structure. The multiple quantum well allows electrons and holes to have a higher possibility to combine with each other and generate light, that improves the luminous efficiency of the light emitting diode 100. Accordingly, the active layer 130 is also called a "light emitting layer."

The first type semiconductor layer 120 and the second type semiconductor layer 140 are disposed on the opposite sides of the active layer 130. For example, the first type semiconductor layer 120 is disposed on a first surface of the active layer 130, and the second type semiconductor layer 140 is disposed on a second surface of the active layer 130. The first type semiconductor layer 120 has a conductivity type different from that of the second type semiconductor layer 140. In some embodiments, the first type semiconductor layer 120 is N-type doped, whereas the second type semiconductor layer 140 is P-type doped. In certain embodiments, the material of the semiconductor layers may include group III-V semiconductor materials, such as group III-nitride semiconductors, group III-phosphide semiconductors, group III-arsenide semiconductors, or group III-phosphorus arsenide semiconductor. In the present embodiment, the first type semiconductor layer 120 may be N-type doped AlInGaP, and the second type semiconductor layer 140 may be P-type doped AlInGaP.

The coupling layer 150 (also referring to as a "bonding layer") is disposed on the second type semiconductor layer 140. In some embodiments, the coupling layer 150 may be made of a light-transmitting material. The term "light-transmitting material" herein refers to a material which allows light emitted from the active layer 130 to transmit there through. In some examples, the coupling layer 150 includes silicon oxide ($SiO_x$), titanium oxide ($TiO_2$), tantalum pentoxide ($Ta_2O_5$), hafnium oxide ($HfO_2$), magnesium oxide (MgO), silicon nitride ($SiN_x$), polymers or a combination thereof.

The sacrificial thin film 160 is disposed on the coupling layer 150. The sacrificial thin film 160 is attached or bonded to the second type semiconductor layer 140 by the coupling layer 150. In other words, the coupling layer 150 is disposed between the sacrificial thin film 160 and the second type semiconductor layer 140. It is noted that a thickness of the sacrificial thin film 160 is less than a total thickness of the first type semiconductor layer 120, the active layer 130, the second type semiconductor layer 140, and the coupling layer 150. In some examples, the thickness of the sacrificial thin film 160 is less than 3 μm, for example, 2 μm, 1 μm, 0.5 μm, or 0.1 μm. In some embodiments, the sacrificial thin film 160 includes a material capable of being dissociated by a laser beam. For example, the material of the sacrificial thin film 160 may be gallium nitride (GaN), aluminum gallium nitride (AlGaN), indium gallium nitride (InGaN), aluminum indium gallium nitride (AlInGaN), or aluminum nitride (AlN)). Accordingly, the sacrificial thin film 160 may serve as a sacrificial layer in a laser lift-off (LLO) process.

In some examples, the light emitting diode 100 further includes a first contact 171 and a second contact 172. The first contact 171 is electrically connected to the first type semiconductor layer 120, and the second contact 172 is electrically connected to the second type semiconductor layer 140. Specifically, the light emitting diode 100 is electrically connected to external routing through the first contact 171 and the second contact 172.

In some examples, the light emitting diode 100 is disposed on a substrate 110. In specifics, the light emitting diode 100 is attached or bounded to the substrate 110 by a connector 180.

In some examples, the light emitting diode 100 further includes an insulating layer 190. The insulating layer 190 covers the sidewalls of the first type semiconductor layer 120, the active layer 130 and the second type semiconductor layer 140. The insulating layer 190 not only provides function of insulation but also enhances the mechanical strength of the structure. Accordingly, the insulating layer 190 protects the first type semiconductor layer 120, the active layer 130, and the second type semiconductor layer 140 from damage.

Figure 2:
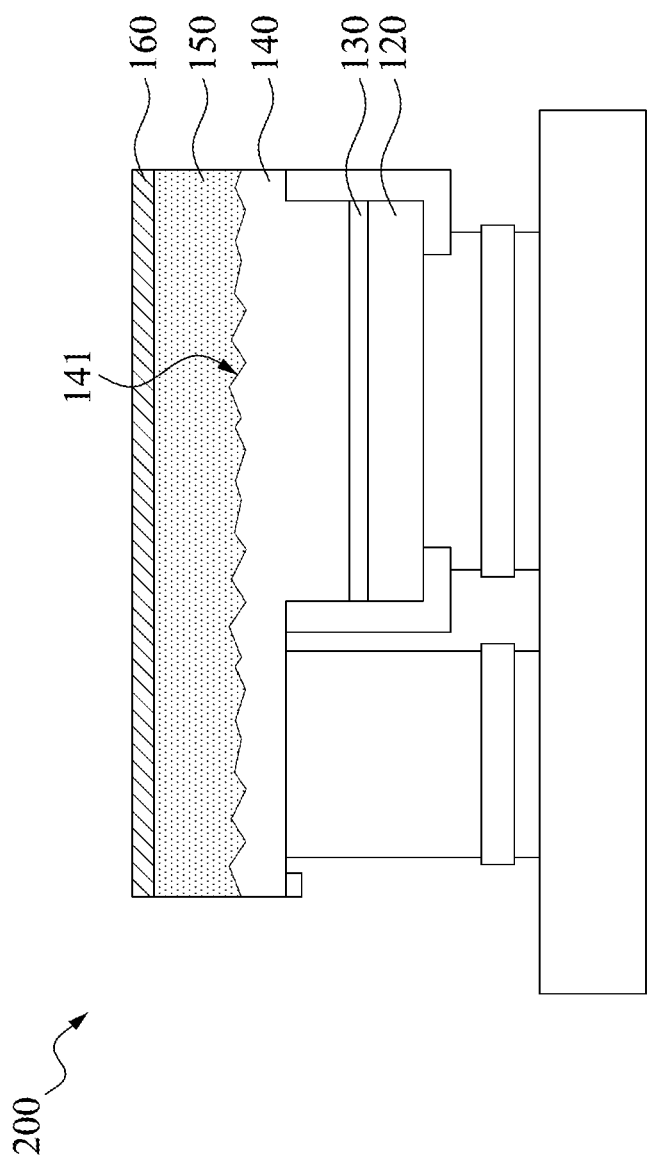
FIG. 2 is a cross-sectional view illustrating a light emitting diode 200 according to another embodiment of the present disclosure.

Reference is made to FIG. 2, which is a cross-sectional view illustrating a light emitting diode 200 according to another embodiment of the present invention. For the purpose of convenience of description, in the respective embodiments of the present disclosure, the same reference numerals are used to refer to the same elements, and the same elements or components are not described herein to avoid repetition. Different from the light emitting diode 100, the second type semiconductor layer 140 of the light emitting diode 200 includes a roughened top surface 141 that is in contact with the coupling layer 150. The roughened top surface 141 prevents the light emitted from the active layer 130 from continuing to be totally reflected between the first type semiconductor layer 120 and the second type semiconductor layer 140. As a result, the light extraction rate of the light emitting diode is increased.

Figure 3:
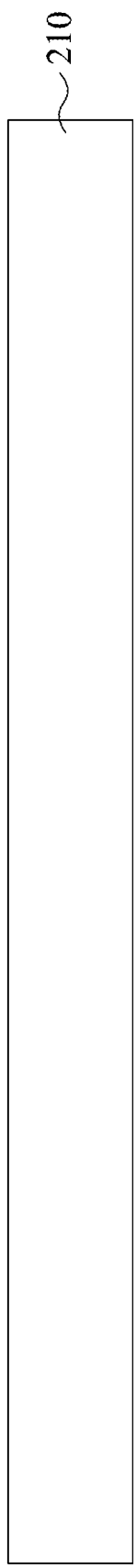
FIGS. 3-8 are cross-sectional views illustrating various process stages of a method for manufacturing a light emitting diode according to one embodiment of the present disclosure.

FIGS. 3-8 are cross-sectional views illustrating various process stages of a method for manufacturing a light emitting diode according to an embodiment of the present invention. Referring to FIG. 3, a first substrate 210 is provided. The first substrate 210 allows a laser beam, used in a subsequent lift-off process, to transmit there through. For example, the first substrate 210 may be made of sapphire, aluminum nitride (AlN), glass, etc.

Figure 4:
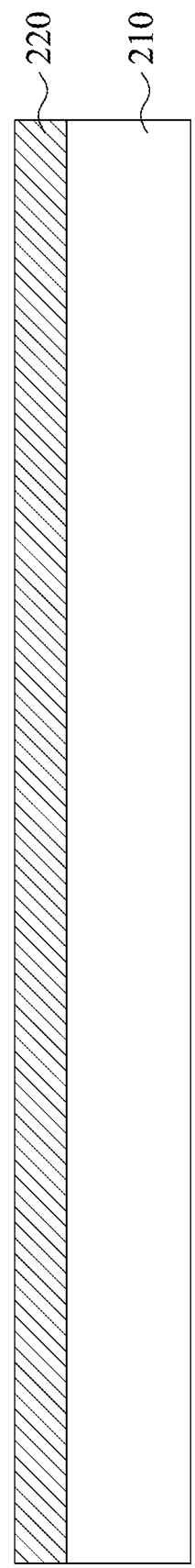

Referring to FIG. 4, a sacrificial thin film 220 is formed on the first substrate 210. As described above, the sacrificial thin film 220 includes a material that may be dissociated by a laser beam. The material of the sacrificial thin film 220 may be gallium nitride (GaN), aluminum gallium nitride (AlGaN), or aluminum nitride (AlN), for example.

It is noted that since the sacrificial thin film 220 serves as the sacrificial layer in the laser lift-off process, the material of the sacrificial thin film 220 is different from that of the first substrate 210. In other words, the band gap of the sacrificial thin film 220 differs from that of the first substrate 210 so that unfavorable effects on the laser lift-off process are avoided.

Figure 5:
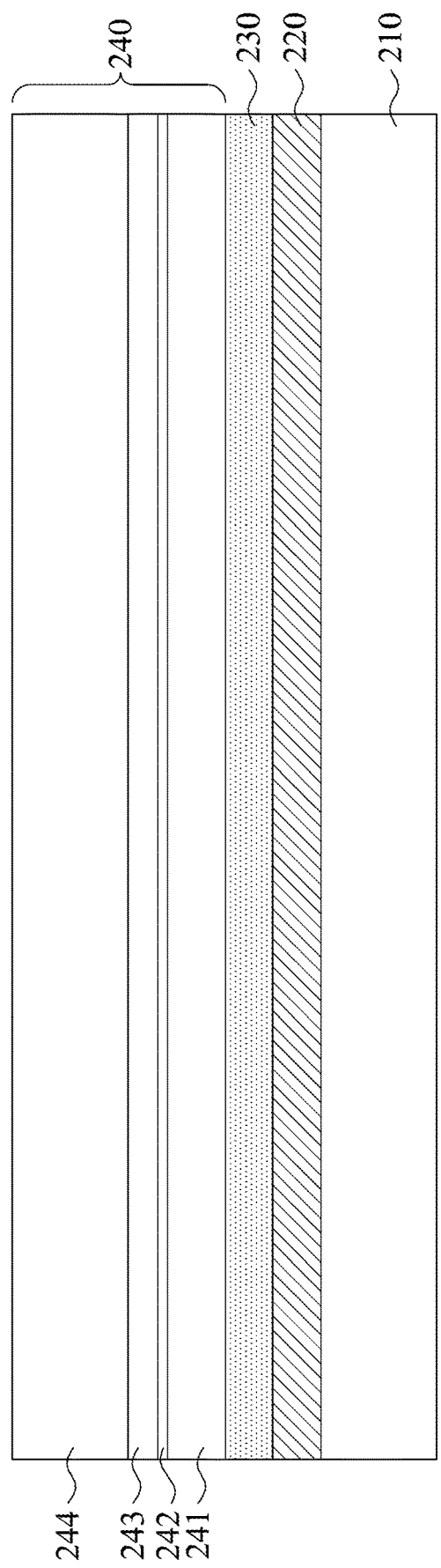

Referring to FIG. 5, an epitaxial structure 240 is attached or bonded to the sacrificial thin film 220 by using a coupling layer 230. The epitaxial structure 240 includes a first type semiconductor layer 241, an active layer 242, a second type semiconductor layer 243, and a second substrate 244. The first type semiconductor layer 241, the active layer 242, the second type semiconductor layer 243, and the second substrate 244 are sequentially arranged over the coupling layer 230, in which the first type semiconductor layer 241 is in contact with the coupling layer 230.

Additionally, the epitaxial structure 240 may be formed by a plurality of epitaxial deposition processes. In some examples, the second type semiconductor layer 243 is formed on the second substrate 244, followed by forming the active layer 242 on the second type semiconductor layer 243. Thereafter, the first type semiconductor layer 241 is formed on the active layer 242. In some examples, after the epitaxial structure 240 is formed, the epitaxial structure 240 is bonded or attached to the sacrificial thin film 220 by using a wafer bonding approach. For instance, the coupling layer 230 may be formed on the sacrificial thin film 220, and then the epitaxial structure 240 is attached to the sacrificial thin film 220 by the coupling layer 230. Alternatively, the coupling layer 230 may be formed on the epitaxial structure 240 (although FIG. 5 shows the coupling layer 230 formed under the epitaxial structure 240), and then the sacrificial thin film 220 and the epitaxial structure 240 are attached to each other by the coupling layer 230.

In some examples, the second substrate 244 includes gallium arsenide (GaAs), silicon, or sapphire, or the like. In addition, the conductivity types of the first type semiconductor layer 241 and the second type semiconductor layer 243 are different. For instance, the first type semiconductor layer 241 is p-type doped, while the second type semiconductor layer 243 is n-type doped. The active layer 242 may be a MQW, which allows electrons and holes to have a higher possibility to combine with each other and generate light.

Figure 6:
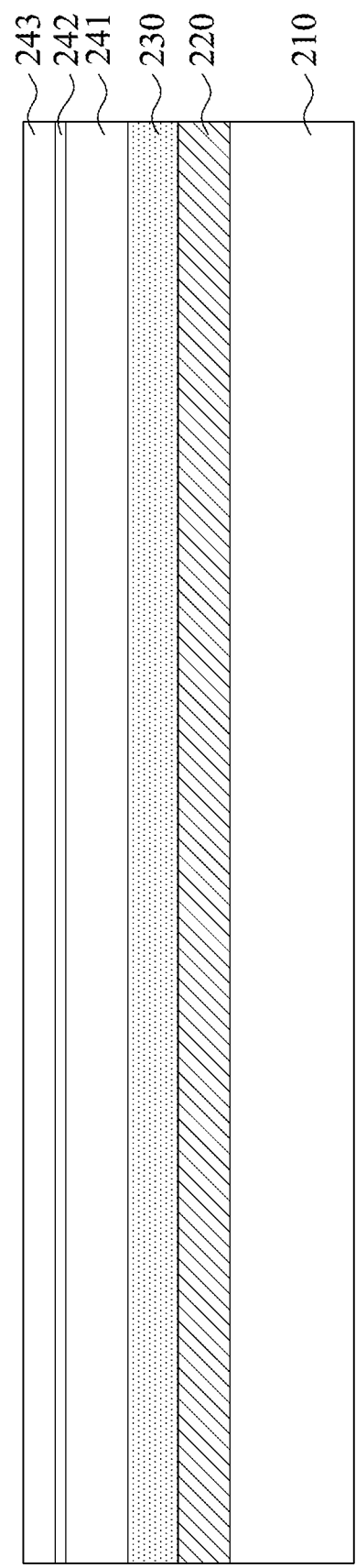

Referring to FIG. 6, the second substrate 244 is removed. In some embodiments, the second substrate 244 may be removed by an etching process, such as a wet etching process.

Figure 7:
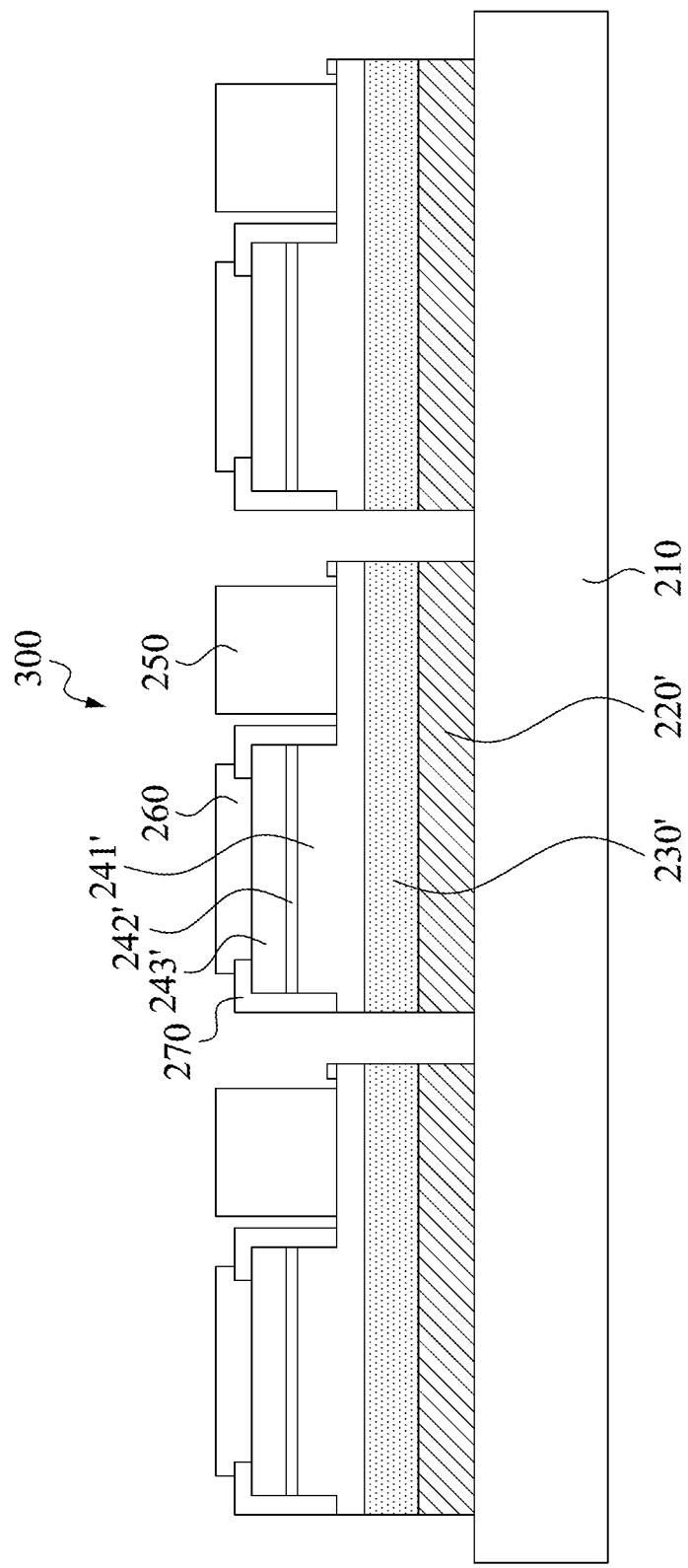

Referring to FIG. 7, a componentization process is performed on the sacrificial thin film 220, the coupling layer 230, the first type semiconductor layer 241, the active layer 242 and the second type semiconductor layer 243, thereby forming a plurality of light emitting diodes 300. In specifics, the componentization process includes performing a patterning process to form a patterned sacrificial thin film 220', a patterned coupling layer 230', a patterned first type semiconductor layer 241', a patterned active layer 242', and a patterned second type semiconductor layer 243'. Furthermore, in some examples, the componentization process further includes forming a first contact 250 and a second contact 260, in which the first contact 250 is positioned on and electrically connected to the patterned first type semiconductor layer 241', and the second contact 260 is positioned on and electrically connected to the patterned second type semiconductor layer 243'. In some examples, the componentization process further includes forming an insulating layer 270 covering the sidewalls of the patterned first type semiconductor layer 241', the patterned active layer 242', and the patterned second type semiconductor layer 243'. The insulating layer 270 not only provides the function of insulation but also enhances the mechanical strength of the structure. Accordingly, the insulating layer 270 protects the patterned first type semiconductor layer 241', the patterned active layer 242', and the patterned second type semiconductor layer 243' from damage.

After the componentization process is carried out, a number of the light emitting diodes 300, separated from each other, are formed on the first substrate 210. In some examples, each light emitting diode 300 includes the patterned sacrificial thin film 220', the patterned coupling layer 230', the patterned first type semiconductor layer 241', the patterned active layer 242', the patterned second type semiconductor layer 243', the first contact 250, the second contact 260, and the insulating layer 270.

Figure 8:
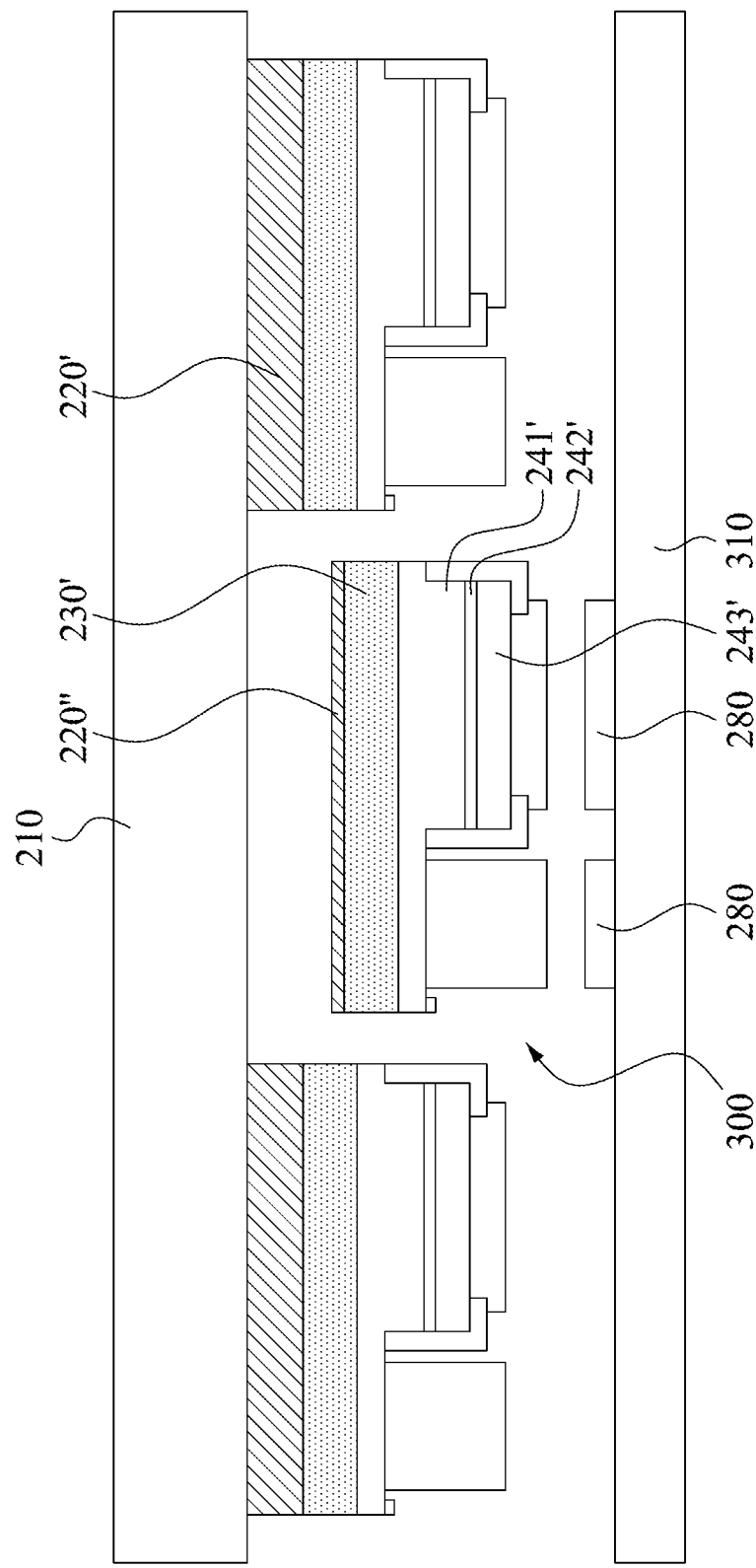

Referring to FIG. 8, a laser lift-off process is performed on the patterned sacrificial thin film 220' such that the light emitting diodes 300 are separated (or detached) from the first substrate 210. In specifics, the patterned sacrificial thin film 220' is illuminated by a laser beam through the first substrate 210 so to form a patterned sacrificial thin film 220'', in which the patterned sacrificial thin film 220' absorbs the energy of the laser beam and is dissociated. In the examples where the patterned sacrificial thin film 220' includes GaN, GaN absorbs the laser beam and is dissociated into Ga and nitrogen gas. Accordingly, after the laser lift-off process is carried out, the thickness of the patterned sacrificial thin film 220'' is decreased. In some examples, the thickness of the patterned sacrificial thin film 220'' is less than a total thickness of the patterned first type semiconductor layer 241', the patterned active layer 242', the patterned second type semiconductor layer 243', and the patterned coupling layer 230'. In some examples, the thickness of the patterned sacrificial thin film 220'' is less than 3 μm, for example, 2 μm, 1 μm, 0.5 μm, or 0.1 μm.

It is noted that in the laser lift-off process disclosed herein, any one of the patterned sacrificial thin films 220'' of the light emitting diodes 300 may be selected to be illuminated. In other words, any one of the light emitting diodes 300 may be chosen to be transferred to another substrate.

In some examples, the light emitting diodes 300 separated from the first substrate 210 may be disposed on a third substrate 310 by a connector 280.

The light emitting diode and the manufacturing method thereof provided herein may reduce the number of mass-transfer processes and improve the yield of the process. Furthermore, additional weakened structures are not needed according to the embodiments of the present invention, and therefore the steps of the manufacturing process are also reduced.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A light emitting diode, comprising:
an active layer;
a first type semiconductor layer and a second type semiconductor layer disposed at opposite sides of the active layer;
a first contact electrically connected to the first type semiconductor layer;
a second contact electrically connected to the second type semiconductor layer;
a coupling layer disposed on the second type semiconductor layer, wherein the coupling layer is in direct contact with the second type semiconductor layer;
a sacrificial thin film disposed on the coupling layer, wherein the coupling layer is disposed between the sacrificial thin film and the second type semiconductor layer, and the sacrificial thin film has a thickness less than a total thickness of the first type semiconductor layer, the active layer, the second type semiconductor layer and the coupling layer; and
an insulating layer being spaced apart from the second contact and covering sidewalls of the active layer, the first type semiconductor layer, and the second type semiconductor layer, wherein at least one sidewall of the sacrificial thin film is free from coverage by the insulating layer, and the at least one sidewall of the sacrificial thin film extends from a lower surface of the sacrificial thin film to an upper surface of the sacrificial thin film.

2. The light emitting diode of claim 1, wherein the second type semiconductor layer comprises a roughened top surface, and the roughened top surface is in direct contact with the coupling layer.

3. The light emitting diode of claim 1, wherein the sacrificial thin film has a thickness less than 3 μm.

4. The light emitting diode of claim 1, wherein the sacrificial thin film comprises gallium nitride (GaN), aluminum gallium nitride (AlGaN), indium gallium nitride (InGaN), aluminum indium gallium nitride (AlInGaN), or aluminum nitride (AlN).

5. The light emitting diode of claim 1, wherein each of the first type semiconductor layer and the second type semiconductor layer comprises a group III-V semiconductor.

6. The light emitting diode of claim 1, wherein the active layer emits a light and the light penetrates through the sacrificial thin film to the outside of the light emitting diode.

7. The light emitting diode of claim 1, further comprising a substrate and a connector on the substrate, wherein the first contact and the second contact connect the substrate by the connector.

8. The light emitting diode of claim 1, wherein the second type semiconductor layer is p-type and the first type semiconductor layer is n-type.

9. The light emitting diode of claim 1, wherein the first contact has a first surface away the sacrificial thin film and the first type semiconductor layer has a second surface away the sacrificial thin film, and wherein the second surface is closer to the sacrificial thin film than the first surface.

10. The light emitting diode of claim 1, wherein the second contact is devoid of overlapping the active layer in a vertical direction.

11. The light emitting diode of claim 1, wherein the second type semiconductor layer comprises a first sidewall and a second sidewall, the first sidewall is closer to the second contact than the second sidewall in a horizontal direction, the insulating layer covers the first sidewall without covering the second sidewall.

12. The light emitting diode of claim 1, wherein the coupling layer comprises a third sidewall not covered by the insulating layer.

13. The light emitting diode of claim 12, wherein the second type semiconductor layer comprises a first sidewall and a second sidewall, the first sidewall is closer to the second contact than the second sidewall in a horizontal direction, the insulating layer covers the first sidewall without covering the second sidewall.

14. The light emitting diode of claim 1, wherein the first contact has a first surface away from the sacrificial thin film and the first surface is devoid of being covered by the insulating layer.

* * * * *